United States Patent
Eastty et al.

(10) Patent No.: US 6,286,020 B1
(45) Date of Patent: Sep. 4, 2001

(54) SIGNAL PROCESSOR DELTA-SIGMA MODULATOR STAGE

(75) Inventors: Peter Charles Eastty, Oxford; Christopher Sleight, Chipping Norton; Peter Damien Thorpe, Oxon; James Andrew Scott Angus, Clifton, all of (GB)

(73) Assignees: Sony Corporation, Tokyo (JP); Sony United Kingdom Limited, Weybridge (GB)

(*) Notice: Subject to any disclaimer, the term of this patent is extended or adjusted under 35 U.S.C. 154(b) by 0 days.

(21) Appl. No.: 08/979,761

(22) Filed: Nov. 26, 1997

(30) Foreign Application Priority Data

Nov. 27, 1996 (GB) .................................. 9624674

(51) Int. Cl.$^7$ ................................................ G06F 17/10
(52) U.S. Cl. .................................... 708/307; 375/247
(58) Field of Search ................. 364/724.04, 724.16; 375/247; 341/143; 708/307, 319

(56) References Cited

U.S. PATENT DOCUMENTS

| | | | | |
|---|---|---|---|---|
| 4,972,360 | * | 11/1990 | Cukier et al. | 364/724.04 |
| 5,181,033 | * | 1/1993 | Yassa et al. | 341/143 |
| 5,420,892 | * | 5/1995 | Okamoto | 375/247 |
| 5,446,460 | * | 8/1995 | Cabler | 341/143 |
| 5,561,660 | * | 10/1996 | Kotowski et al. | 375/247 |
| 5,768,316 | * | 6/1998 | Sogo | 375/247 |
| 5,835,042 | * | 11/1998 | Ichimura et al. | 375/247 |

* cited by examiner

Primary Examiner—David H. Malzahn
(74) Attorney, Agent, or Firm—Frommer Lawrence & Haug, LLP.; William S. Frommer

(57) ABSTRACT

A 1-bit nth order Delta Sigma Modulator where n is at least one comprises a linear signal processing section (50) which processes the 1-bit signal and produces a p bit output, a filter (52) which filters the p bit signal, an adder (53) a quantizer Q coupled to the output of the adder (53) to quantize a p bit signal to a 1-bit output signal, and a noise shaping section 51 which feeds the 1-bit output signal back to the adder 53.

8 Claims, 3 Drawing Sheets

SIGNAL PROCESSOR DELTA-SIGMA MODULATOR STAGE

BACKGROUND OF THE INVENTION

1. Field of the invention

The present invention relates to a 1-bit signal processor comprising an nth order Delta-Sigma Modulator where n is at least one. Preferred embodiments of the invention relate to processing audio signals but the invention is not limited to audio signal processors.

2. Description of the Prior Art

Background to the present invention will now be described by way of example with reference to FIGS. 1, 2 and 3 of the accompanying drawings of which FIG. 1 is a block diagram of a known Delta-Sigma ADC, FIG. 2 is a block diagram of a previously proposed Delta-Sigma Modulator configured as an nth order filter section and FIG. 3 shows a noise shaping characteristic.

It is known to convert an analogue signal to a digital form by sampling the analogue signal at at least the Nyquist rate and encoding the amplitudes of the samples by an m bit number. Thus if m=8, the sample is said to be quantized to an accuracy of 8 bits. In general m can be any number of bits equal to or greater than 1.

For the purpose of quantizing to only 1 bit, it is known to provide an analogue to digital converter (ADC) known either as a "Sigma-Delta ADC" or as a "Delta-Sigma ADC". Herein the term "Delta-Sigma" is used. Such an ADC is described in for example "A Simple Approach to Digital Signal Processing" by Craig Marven and Gillian Ewers ISBN 0-904.047-00-8 published 1993 by Texas Instruments.

Referring to FIG. 1 in an example of such an ADC, the difference 1 (Delta) between an analogue input signal and the integral 2 (Sigma) of the 1-bit output signal is fed to a 1-bit quantizer 3. The output signal comprises bits of logical value 0 and 1 but representing actual values of −1 and +1 respectively. The integrator 3 accumulates the 1-bit outputs so that the value stored in it tends to follow the value of the analog signal. The quantizer 3 increases (+1) or reduces (−1) the accumulated value by 1-bit as each bit is produced. The ADC requires a very high sampling rate to allow the production of an output bit stream the accumulated value of which follows the analogue signal.

The term "1-bit" signal as used in the following description and in the claims means a signal quantized to an accuracy of 1 digital bit such as is produced by a Delta-Sigma ADC.

A Delta-Sigma Modulator (DSM) configured as an nth order filter section for directly processing a 1-bit signal was proposed by N. M. Casey and James A. S. Angus in a paper presented at 95th AES Convention Oct. 7–10, 1993 New York, USA entitled "One Bit Digital Processing of Audio Signals"—Signal Processing: Audio Research Group, The Electronics Department, The University of York, Heslington, York YO1 5DD England, FIG. 2 shows a 3rd order (n=3) version of such a DSM filter section.

Referring to FIG. 2, the DSM has an input 4 for a 1-bit audio signal and an output 5 at which a processed a 1-bit signal is produced. The bits of the 1-bit signal are clocked through the DSM by known clocking arrangements which are not shown. The output 1-bit signal is produced by a 1-bit quantizer Q which is for example a comparator having a threshold level of zero. The DSM has three stages each comprising a first 1-bit multiplier $a_1, a_2, a_3$ connected to the input 4, a second 1-bit multiplier $c_1, c_2, C_3$ connected to the output 5, an adder $6_1, 6_2, 6_3$ and an integrator $7_1, 7_2, 7_3$.

The 1-bit multipliers multiply the received 1-bit signal by p bit coefficients $A_1, A_2, A_3, C_1, C_2, C_3$ producing p bit products which are added by the adders $6_1, 6_2, 6_3$ and the sums passed to the integrators 7. In the intermediate stages the adders $6_2, 6_3$ also sum the output of the integrator of the preceding stage. A final stage comprises another 1-bit multiplier $A_4$ connected to the input which multiplies the input signal by a p bit coefficient $A_4$ and an adder $6_4$ which adds the product to the output of the integrator $7_3$ of the preceding stage. The sum is passed to the quantizer Q.

Within the DSM, two's complement arithmetic maybe used to represent the positive and negative p bit numbers. The input to the quantizer Q may be positive, quantized at the output as +1 (logical 1), or negative, quantized at the output as −1 (logical 0).

As observed by Casey and Angus "a one bit processor . . . will produce a one bit output that contains an audio signal that is obscured by noise to an unacceptable level and it is imperative the quantization noise is suitably shaped". The noise which obscures the audio signal is the quantization noise produced by the quantizer Q.

The quantizer Q may be modelled as an adder which has a first input receiving an audio signal and a second input receiving a random bit stream (the quantization noise) substantially uncorrelated with the audio signal. Modelled on that basis, the audio signal received at the input 4 is fed forward by multipliers $a_1, a_2, a_3, a_4$ to the output 5 and fed back by multipliers $c_1, C_2, C_3$ from the output 5. Thus coefficients A1 to A4 in the feed forward path define zeros of the Z-transform transfer function of the audio signal and coefficients C1–C3 in the feedback path define poles of the transfer function of the audio signal.

The noise signal, however is fed-back from the quantizer by the multipliers $C_1$–$C_3$ so that coefficients C1–C3 define poles of the transfer function of the noise signal. The transfer function of the noise signal is not the same as that of the input signal.

The coefficients A1 to A4 and C1 to C3 are chosen to provide circuit stability amongst other desired properties.

The coefficients C1–C3 are chosen to provide noise shaping so as to minimise quantization noise in the audio band, as shown for example in FIG. 3 by the full line 31.

The coefficients A1–A4 and C1–C3 are also chosen for a desired audio signal processing characteristic.

The coefficients A1–A4 and C1–C3 may be chosen by:
  a) finding the Z-transform H(z) of the desired filter characteristic—e.g noise shaping function; and
  b) transforming H(z) to coefficients.
  This may be done by the methods described in "Theory and Practical Implementation of a Fifth Order Sigma-Delta A/D Converter, Journal of Audio Engineering Society, Volume 39, no. 7/8, 1991 July/August by R. W Adams et al."
and in
  the paper by Angus and Casey mentioned herein above using the knowledge of the person skilled in the art. One way of calculating the coefficients is outlined in the accompanying Annex A.

It is proposed herein that a signal processor may comprise a plurality of DSMs coupled in series or cascaded, to process 1-bit signals. Such a proposal is not known from the aforesaid papers.

It is desirable to provide signal filtering between DSMs and also to maintain a 1-bit signal stream between DSMs. Such filtering may be needed for example to prevent undesired build-up of quantisation noise in successive DSMs. However, suitable digital filters would at least sum bits of the stream resulting in multi-bit numbers and/or multiply the bit stream by one or more p bit coefficients. All the coefficient multipliers of a DSM downstream of such a filter would then receive a p bit signal and would need to be p bit multipliers which are uneconomic.

SUMMARY OF THE INVENTION

According to one aspect of the present invention, there is provided a signal processor comprising a series arrangement of 1-bit nth order Delta-Sigma Modulator stages with inter stage filtering, each stage having an input for receiving a 1-bit signal, an output for outputting a processed 1-bit signal, a linear signal processing section including a 1-bit multiplier which produces a p bit signal in response to the input 1-bit signal, and a filter section providing a desired inter stage filter characteristic and operating on the said p bit signal, and a noise shaping section which feeds back the processed 1 bit signal to a summer at the output of the filter section for summing with the filtered signal, and a quantizer which converts the summed signal to the processed 1-bit signal at the said output.

According to another aspect of the invention, there is provided a 1-bit nth order (where n is two or more) Delta-Sigma Modulator stage for use in a signal processor having a plurality of Delta-Sigma Modulator stages in cascade, the stage having an input for receiving a 1-bit signal, an output for outputting a processed 1-bit signal, a linear signal processing section including a 1-bit multiplier which produces a p bit signal in response to the input 1-bit signal, and a filter section providing a desired inter stage filter characteristic and operating on the said p bit signal, and a noise shaping section which feeds back the processed 1-bit signal to a summer at the output of the filter section for summing with the filtered signal, and a quantizer which converts the summed signal to the processed 1-bit signal at the said output.

In accordance with the invention the inter-stage filter is provided within the DSM and operates on the p bit signals (where p>1) within the DSM minimising the number (if any) of p-bit multipliers in the DSM and in any subsequent DSM.

In a preferred embodiment, the inter-stage filter is a low pass filter which reduces noise outside the desired signal band to maintain stability of any DSM downstream of the filter.

The low pass filter may comprise delay elements and an adder for summing delayed bits. The filter may also comprise one or more coefficient multipliers. Although the or each multiplier would produce a p bit number for a p bit coefficient, the 1-bit form is restored by the subsequent non-linear section. Thus the input signal to any downstream DSM is in 1-bit form.

BRIEF DESCRIPTION OF THE DRAWINGS

The above and other objects, features and advantages of the invention will be apparent from the following detailed description of illustrative embodiments which is to be read in connection with the accompanying drawings, in which.

DESCRIPTION OF THE PREFERRED EMBODIMENTS

Figure 4:
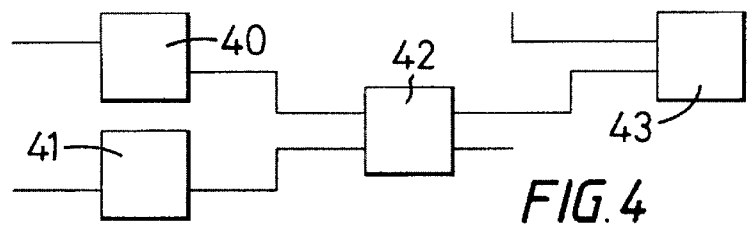
FIG. 4 is a schematic block diagram of an audio signal processor having a plurality of nth order DSMs in series.

Referring to FIG. 4 an audio signal processor operating on 1-bit signals may comprise a plurality of 1-bit signal processing stages in the form of Delta-Sigma Modulators (DSM) 40 to 43 cascaded in series. The DSMs may be used in mixers and faders. An example of such an audio signal processor is described in co-filed UK patent application 9624671.5 entitled "Signal Processor", U.S. application Ser. No. 08/978,844, filed Nov. 26, 1997, now U.S. Pat. No. 6,078,621, incorporated herein by reference, although the present invention is not limited to such an audio signal processor.

Figure 5:
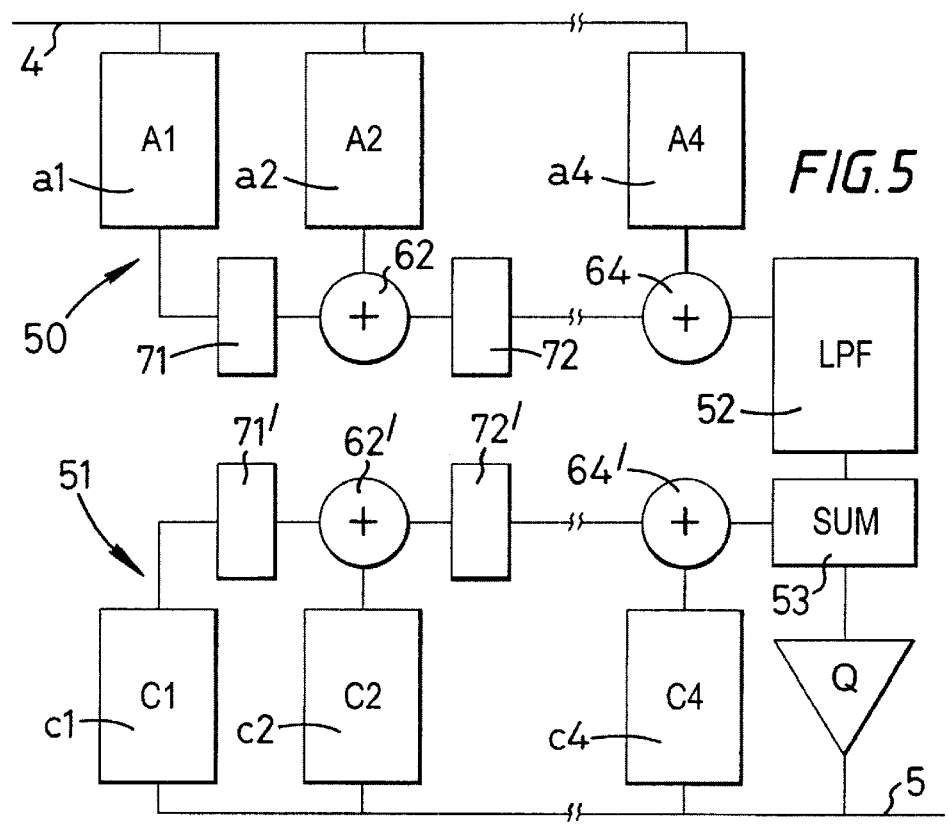
FIG. 5 is a schematic block diagram of an nth order DSM of the processor of FIG. 4.

At least one of the DSMs of FIG. 4 is as shown in FIG. 5 which shows an illustrative DSM in accordance with the invention.

The nth order DSM of FIG. 5 comprises a linear, audio signal processing portion 50 which receives a 1-bit signal on an input 4, a linear noise shaping portion 51, a low pass filter 52 which filters the output of the audio signal portion 50, a summer 53 which sums the output of the low pass filter 52 and the output of the noise shaping portion 51 and a quantizer Q which converts the output signal of the summer 53 to 1-bit form and supplies the 1-bit signal to the output 5 of the DSM. The DSM is controlled by a clock circuit (not shown) in known manner.

The DSM 50 is preferably 3rd order (i.e. n=3) having in both the audio signal portion 50 and in the noise shaping portion 51 three integration stages, (only two being shown). Each integrator stage comprises at least a 1-bit coefficient multiplier a1, a2, c1, c2 and an integrator 71, 71', 72, 72'. Integrator stages ($a_2$, 62, 72) other than the first (a1, 61, 71) further comprise an adder (62), for summing the output from the integrator (71) of the previous stage with the output of the 1-bit multiplier $a_2$ of the current stage. As shown in FIG. 5, a final non-integrator stage $a_4$, 64, $C_4$, 64 is provided, comprising a 1-bit multiplier a4, c4 and an adder 64, 64'.

Figure 7:
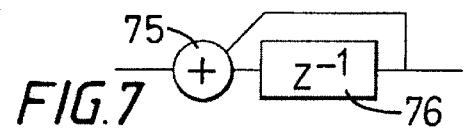
FIG. 7 is a schematic block diagram of an integrator of the DSM of FIG. 5.

An example of an integrator 71, 72, 71', 72' is shown in FIG. 7. It comprises a delay element 76 and adder 75 and a feedback connection from the output of the delay element to the adder. The adder accumulates the integral of the signals applied to it.

It is not essential to provide in one integration stage e.g. $a_2$, 62, 72, both an adder 75 and an adder 62. The two adders maybe replaced by a single adder.

Figure 1:
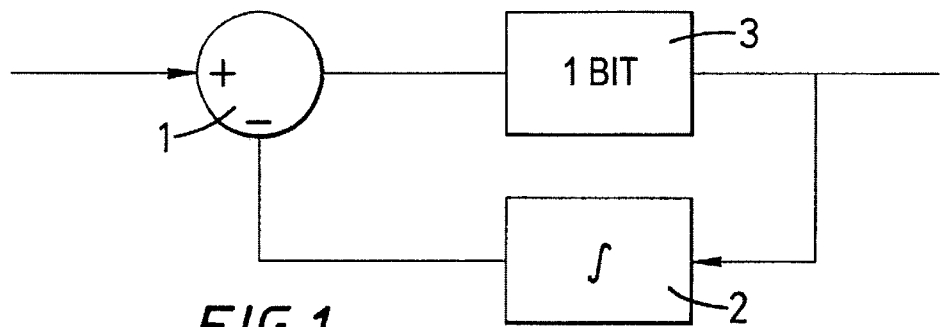
FIG. 1 is a schematic block diagram of an analog to digital converter.
Figure 2:
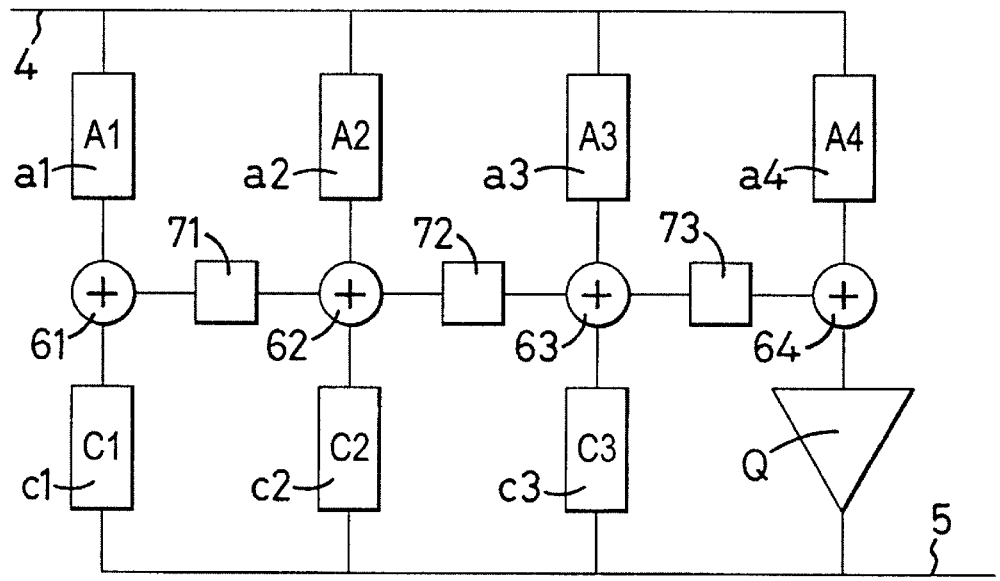
FIG. 2 is a schematic block diagram of a Delta-Sigma Modulator.

The coefficients A1 to A4 and C1 to C4 are calculated in the same manner as described above with reference to FIG. 2.

Figure 6:
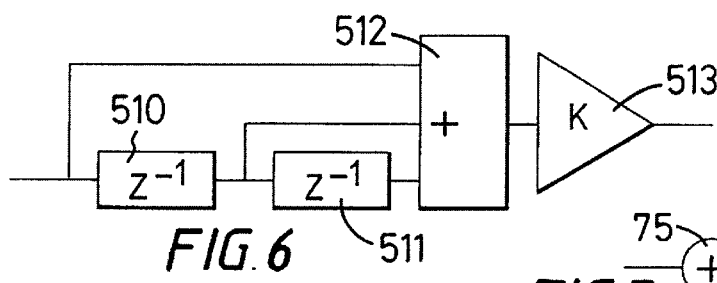
FIG. 6 is a schematic block diagram of an example of low pass filter in the DSM of FIG. 5.

An example of the low pass filter 52 is shown in FIG. 6. The filter comprises two delay elements 510, 511 in series, an adder 512 and a coefficient multiplier 513. The adder 513 adds 3 signal samples and the multiplier 513 multiplies the sum by a single coefficient K. Samples fed to the adder are p bit samples from the adder 64 of the audio signal processor. The multiplier K multiplies coefficient and produces a product signal which is summed with the output of the noise shaping portion 57 in the adder 53. The resultant sum is requantized to 1-bit form by the comparator or quantizer Q.

Figure 3:
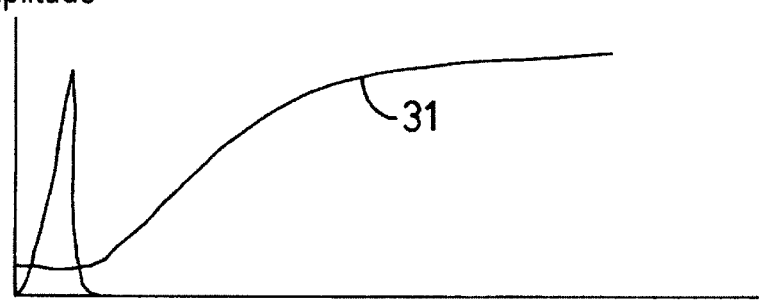
FIG. 3 shows a noise shaping characteristic.

Referring to FIG. 3, the low pass filter provides a filter characteristic as shown by dotted line 30. Quantisation noise in the audio band (in-band noise) is reduced but not eliminated. However noise outside the audio band (out-of-band noise) from the preceding DSM in the series is eliminated or at least much reduced. This is believed to be advantageous in maintaining stability of subsequent DSMs because it is thought that any accumulation of noise, whether in-band or out-of-band, may reduce stability.

Whilst the low pass filter 52 shown in FIG. 6 has a multibit multiplier 6 which is expensive, by positioning it between the outputs of the portions 50 and 51 and input of the quantizer Q, the multipliers $a_1$ to $a_4$ and $c_1$ to $C_4$ are retained as 1-bit multipliers. If the low pass filter 52 was positioned upstream of the input 4 of a DSM, the multipliers $a_1$–$a_4$ and $c_1$–$c_4$ would need to be multibit multipliers which is not desired.

It may be thought that the separation of the two portions 50 and 51 would lead to instability because for stability the zeroes provided by the section 50 compensate for the poles provided by the section 51. Instability in practice maybe caused by for example a long run of logical '1's accumulating a large integral value in one of the integrators. In a practical example of the DSM, two's complement arithmetic is used and the adders in the integrators "wrap round". That is once the maximum value of the adder 75 is reached, further increase causes its value to go to zero and begin to increase again. This prevents instability due to the separation.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

CALCULATING COEFFICIENTS

This annex outlines a procedure for analysing a fifth order DSM and for calculating coefficients of a desired filter characteristic.

Figure 8:
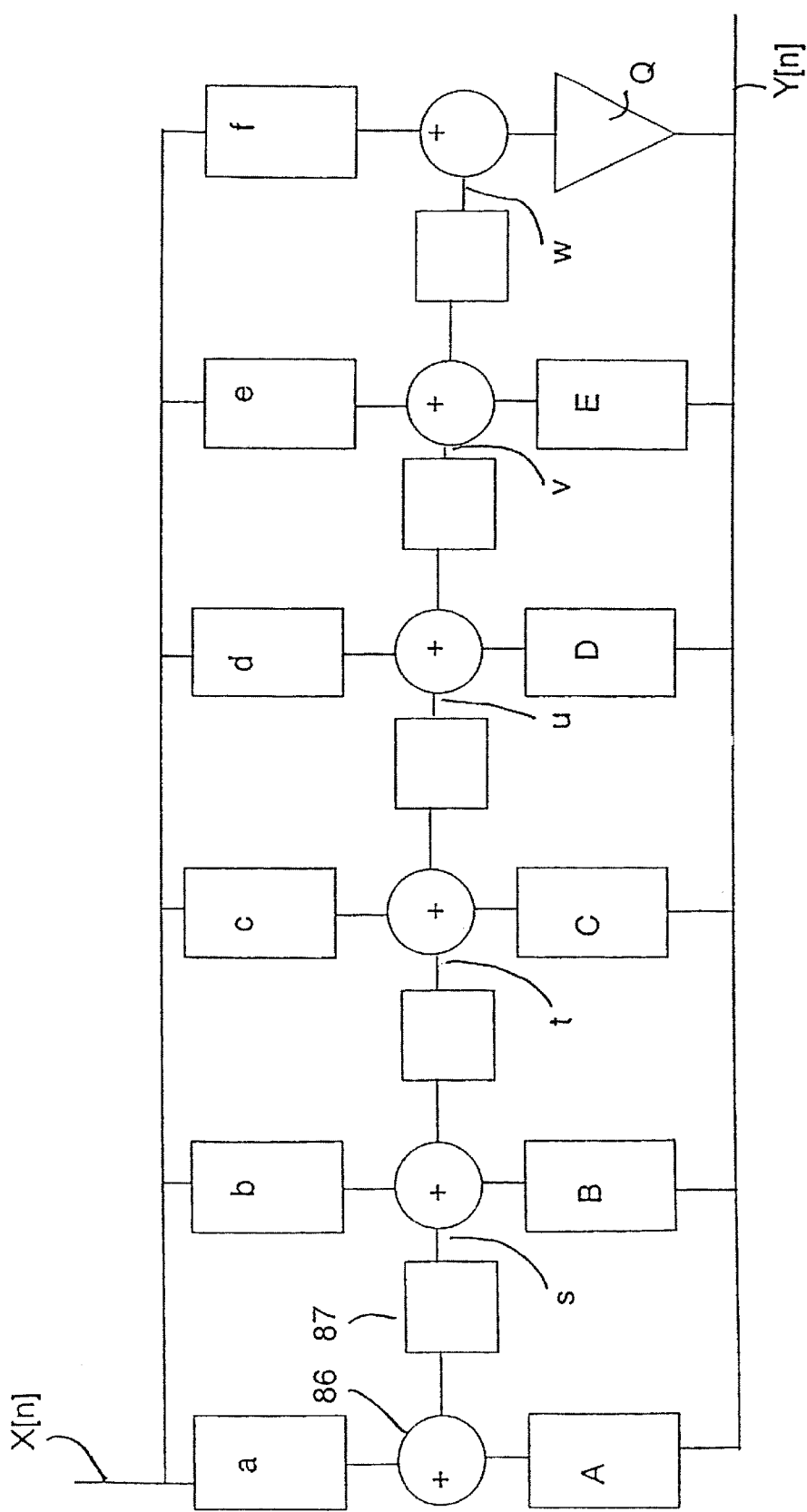
FIG. 8 is a schematic block diagram of a Delta-Sigma Modulator.

A fifth order DSM is shown in FIG. 8 having coefficients a to f and A to E, adders 86 and integrator 87. Integrator 87 each provide a unit delay. The outputs of the integrators are denoted from left to right s to w. The input to the DSM is a signal x[n] where [n] denotes a sample in a clocked sequence of samples. The input to the quantizer Q is denoted y[n] which is also the output signal of the DSM. The analysis is based on a model of operation which assumes quantizer Q is simply an adder which adds random noise to the processed signal. The quantizer is therefore ignored in this analysis.

The signal y[n]=fx[n]+w[n] i.e. output signal y[n] at sample [n] is the input signal x[n] multiplied by coefficient f plus the output w[n] of the preceding integrator 7.

Applying the same principles to each output signal of the integrators 7 results in Equations set 1.

$y[n]=fx[n]+w[n]$ $w[n]=w[n-1]+ex[n-1]+Ey[n-1]+v[n-1]$ $v[n]=v[n-1]+dx[n-1]+Dy[n-1]+u[n-1]$ $u[n]=u[n-1]+cx[n-1]+Cy[n-1]+t[n-1]$ $t[n]=t[n-1]+bx[n-1]+By[n-1]+s[n-1]$ $s[n]=s[n-1]+ax[n-1]+Ay[n-1]$

These equations are transformed into z-transform equations as well known in the art resulting in equations set 2.

$Y(z)=fX(z)+W(z)$ $W(z)(1-z^{-1})=z^{-1}(eX(z)+EY(z)+V(z))$ $V(z)(1-z^{-1})=z^{-1}(dX(z)+DY(z)+U(z))$ $U(z)(1-z^{-1})=z^{-1}(cX(z)+CY(z)+T(z))$ $T(z)(1-z^{-1})=z^{-1}(bX(z)+BY(z)+S(z))$ $S(z)(1-z^{-1})=z^{-1}(aX(z)+AY(z))$

The z transform equations can be solved to derive Y(z) as a single function of X(z) (Equation 3)

$$Y(z) = fX(z) + \frac{z^{-1}}{(1-z^{-1})}\left(eX(z) + EY(z)\frac{z^{-1}}{1-z^{-1}}\left(dX(z) + DY(z) + \frac{z^{-1}}{1-z^{-1}}\left(cX(z) + CY(z) + \frac{z^{-1}}{1-z^{-1}}\left(bX(z) + BY(z) + \frac{z^{-1}}{1-z^{-1}}(aX(z) + AY(z))\right)\right)\right)\right)$$

This may be reexpressed as shown in the right hand side of the following equation, Equation 4. A desired transfer function of the DSM can be expressed in series form $\frac{Y(z)}{X(z)}$ given in left hand side of the following equation and equated with the right hand side in Equation 4.

$$\frac{Y(z)}{X(z)} = \frac{\alpha_0 + \alpha_1 z^{-1} + \alpha_2 z^{-2} + \alpha_3 z^{-3} + \alpha_4 z^{-4} + \alpha_5 z^{-5}}{\beta_0 + \beta_1 z^{-1} + \beta_2 z^{-2} + \beta_3 z^{-3} + \beta_4 z^{-4} + \beta_5 z^{-5}}$$

$$= \frac{f(1-z^{-1})^5 + z^{-1}e(1-z^{-1})^4 + z^{-2}d(1-z^{-1})^3 + z^{-3}c(1-z^{-1})^2 + z^{-4}b(1-z^{-1}) + z^{-5}a}{(1-z^{-1})^5 - z^{-1}E(1-z^{-1})^4 - z^{-2}D(1-x^{-1})^3 - z^{-3}C(1-z^{-1})^2 - z^{-4}B(1-z^{-1}) - Z^{-5}A}$$

Equation 4 can be solved to derive the coefficients f to a from the coefficients $\alpha_0$ to $\alpha_5$ and coefficients E to A from the coefficients $\beta_0$ to $\beta_5$ as follows noting that the coefficients $\alpha_n$ and $\beta_n$ are chosen in known manner to provide a desired transfer function.

f is the only $z^0$ term in the numerator. Therefore $f=\alpha_0$.

The term $\alpha_0(1-z^{-1})^5$ is then subtracted from the left hand numerator resulting in $\alpha_0 +=_1 Z^{-1} \ldots + \ldots \alpha_5 z^{-5} - \alpha_0(1-z^{-1})^5$ which is recalculated.

Similarly $f(1-z^{-1})^5$ is subtracted from the right hand numerator. Then e is the only $z^{-1}$ term and can be equated with the corresponding $\alpha_1$ in the recalculated left hand numerator.

The process is repeated for all the terms in the numerator.

The process is repeated for all the terms in the denominator.

We claim:

1. A signal processor comprising a series arrangement of 1-bit nth order (where n is one or more) Delta-Sigma Modulator stages with inter stage filtering, each stage having an input for receiving a 1-bit signal;

an output for outputting a processed 1-bit signal;

a linear signal processing section which produces a p bit signal in response to the input 1-bit signal;

a filter section providing a desired inter stage filter characteristic and operating on said p bit signal;

a noise shaping section for shaping a signal corresponding to a processed 1 bit signal such that noise is minimized and feeding back the shaped signal to a summer at the output of the filter section for summing the shaped signal with the filtered signal; and a quantizer which converts the summed signal to the processed 1-bit signal at said output.

2. The signal processor according to claim 1, wherein the filter section is a low pass filter for reducing quantization noise from a preceding stage.

3. The signal processor according to claim 1, which is an audio signal processor.

4. The signal processor according to claim 1, wherein n=3.

5. A 1-bit nth order (where n is one or more) Delta-Sigma Modulator stage for use in a signal processor having a plurality of Delta-Sigma Modulator stages in cascade, the stage comprising:

an input for receiving a 1-bit signal;

an output for outputting a processed 1-bit signal;

a linear signal processing section which produces a p bit signal in response to the input 1-bit signal;

a filter section providing a desired inter stage filter characteristic and operating on said p bit signal;

a noise shaping section for shaping a signal corresponding to a processed 1-bit signal such that noise is minimized and feeding back the shaped signal to a summer at the output of the filter section for summing the shaped signal with the filtered signal; and a quantizer which converts the summed signal to the processed 1-bit signal at said output.

6. The stage according to claim 5, wherein n is 3 or more.

7. A stage according to claim 5 wherein the filter section is a low pass filter.

8. A 1-bit nth order (where n is one or more) Delta-Sigma Modulator stage comprising:

an input for receiving a 1-bit signal;

an output for outputting a processed 1-bit signal;

a linear signal processing section which produces a p bit signal in response to the input 1-bit signal;

a filter section providing a desired filter characteristic and operating on said p bit signal;

a noise shaping section for shaping a signal corresponding to a processed 1-bit signal such that noise is minimized and feeding back the shaped signal to a summer at the output of the filter section for summing with the filtered signal; and a quantizer which converts the summed signal to the processed 1-bit signal at said output.

* * * * *